(12) United States Patent
Holonyak, Jr.

(10) Patent No.: US 6,369,403 B1
(45) Date of Patent: Apr. 9, 2002

(54) SEMICONDUCTOR DEVICES AND METHODS WITH TUNNEL CONTACT HOLE SOURCES AND NON-CONTINUOUS BARRIER LAYER

(75) Inventor: Nick Holonyak, Jr., Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/579,545

(22) Filed: May 26, 2000

Related U.S. Application Data
(60) Provisional application No. 60/136,159, filed on May 27, 1999.

(51) Int. Cl.$^7$ .............................................. H01L 29/06
(52) U.S. Cl. ............................ 257/13; 257/14; 257/30; 257/97; 372/43; 372/46
(58) Field of Search ............................. 257/13, 14, 30, 257/37, 39, 96, 97, 106; 372/43, 45, 46

(56) References Cited

U.S. PATENT DOCUMENTS

| | | | | |
|---|---|---|---|---|
| 4,752,934 A | * | 6/1988 | Fukuzawa et al. | 372/46 |
| 5,212,706 A | * | 5/1993 | Jain | 372/50 |
| 5,371,379 A | * | 12/1994 | Narusawa | 257/14 |
| 5,509,024 A | * | 4/1996 | Bour et al. | 372/45 |
| 5,909,614 A | * | 6/1999 | Krivoshlykov | 438/29 |
| 5,936,266 A | | 8/1999 | Holonyak, Jr. et al. | 257/106 |

OTHER PUBLICATIONS

K. Eberl, "Quantum Dot Lasers", Physics World, Sep. 1977, pp. 47–50.

H. Saito et al., "Room Temperature Lasing Operation Of A Quantum Dot Vertical Cavity Surface Emitting Laser", Appl. Phys. Lett. 69 (21), Nov. 18, 1996, pp. 3140–3142.

M. Maximov et al., "High Power Continuous Wave Operation InGaAs/AlGaAs Quantum Dot Laser", J. Appl. Phys., 83, May 10, 1998, pp. 5561–5563.

T.A. Richard et al., "High Current density Carbon–Doped Strained–Layer GaAs ($p^+$)–InGaAs($n^+$)–GaAs($n^+$)p–n Tunnel Diodes", Appl. Phys. lett. 63 (26) Dec. 27, 1993, pp. 3613–3615.

T. Mano et al., "New Self–Organized Growth Method For InGaAs Quantum Dots On GaAs(001) Using Droplet Epitaxy", Jpn.J. Appl. Phys. vol. 38 (1999) pp. 1009–1011.

* cited by examiner

*Primary Examiner*—Sara Crane
(74) *Attorney, Agent, or Firm*—Martin Novack

(57) ABSTRACT

A semiconductor light emitting device is disclosed. The device has a tunnel junction disposed between a p-type layer and an n-type layer. The tunnel junction includes a tunnel barrier that is a non-continuous layer. The device also includes means for causing lateral electron flow into the tunnel junction.

20 Claims, 2 Drawing Sheets

SEMICONDUCTOR DEVICES AND METHODS WITH TUNNEL CONTACT HOLE SOURCES AND NON-CONTINUOUS BARRIER LAYER

RELATED APPLICATION

This application claims priority from U.S. Provisional Patent Application No. 60/136,159, filed May 27, 1999, and said Provisional Patent Application is incorporated herein by reference.

This invention was made with Government support under Contract DAAH04-96-1-033 of Army Research Office, under Contract MDA972-94-1-004 of DARPA Center of Optoelectronics Science and Technology, and under the Grant SBCUTC-97-0080 of National Science Foundation. The Government has certain rights in this invention.

BACKGROUND OF THE INVENTION

This invention relates to semiconductor devices and methods. The invention has particularly advantageous application to III–V semiconductor light emitting devices, including semiconductor lasers and semiconductor light emitting diodes (LEDs).

In the U.S. Pat. No. 5,936,266 of Holonyak et al. there are disclosed III–V semiconductor devices and methods in which the amount of p-type material can be minimized, with attendant advantages in electrical, thermal, and optical performance, and in fabrication. A form of that invention is directed to a generally planar semiconductor device wherein a layer of p-type semiconductor material is disposed over (that is, directly on or with one or more intervening layers) a layer of n-type semiconductor material, and an electric potential is coupled between the p-type layer and the n-type layer, and wherein current in the device that is lateral to the plane of the layers is coupled into the p-type layer. A tunnel junction is provided adjacent the p-type layer for converting the lateral current into hole current. The tunnel junction can be an n+/p+ junction oriented with the p+ portion thereof adjacent said p-type layer. The lateral current can be electron current in the n+ layer and/or electron current in a further layer of n-type material disposed over the tunnel junction. An objective of the referenced invention was to minimize the amount of p-type material (with low mobility hole conduction) and, to the extent possible, employ only n-type layers (electron conduction) to carry the device current. In addition to electrical and thermal performance advantages from reducing the amount of lossier p-type material, optical advantage can also accrue since p-type material of the same conductance as n-type material will generally be more absorptive of the light being generated in semiconductor light emitting devices. Conversely, it was noted that since the tunnel contact junction is highly doped, it should be kept relatively thin to avoid undue light absorption.

It is among the objects of the present invention to provide devices of the general type described above, but with novel structural modification that can result in further operational improvement.

SUMMARY OF THE INVENTION

A form of the invention set forth in the above-referenced U.S. Pat. No. 5,936,266 utilizes a quantum well lower gap barrier layer, for example of $In_yGa_{1-y}As$, between the p+ GaAs and n+ GaAs layers to reduce energy gap and carrier mass, and increase tunneling probability.

In accordance with a feature hereof, the thin $In_xGa_{1-x}As$ layer can be non-continuous. The $In_xGa_{1-x}As$ layer could be "cut up" into parallelepiped boxes or quantum boxes or quantum dots (as in quantum dot injection devices, e.g., lasers) but, for the present purpose, to provide an array of thin tiny box-like or dot-like tunnel barriers. An electron tunnels with high probability via the dot. Thus, for example, in a VCSEL driven with lateral electron current, sufficient injection is expected (via the tunnel dots or islands) for VCSEL operation, but with reduced absorption of the recombination radiation (photons) in the laser operation directed vertically through the tunnel region. Thus, a tunnel contact of reduced absorption is possible in spite of the lower gap of the quantum dot barriers.

Quantum dot injection devices, such as quantum dot lasers, are known in the art, such as for the purpose of lowering threshold currents in laser diodes. As described, for example, in K. Eberl, "Quantum Dot Lasers", Physics World, September, 1997, a quantum dot confines the motion of electrons in all three spatial directions such that electronic states are squeezed into discrete transition energies so that fewer carriers are needed to create a population inversion. Temperature dependence is also reduced due to the discrete energy spectrum and large separation between energy levels. For examples of quantum dot devices and techniques, see H. Saito et al., "Room Temperature Lasing Operation Of A Quantum Dot Vertical Cavity Surface Emitting Laser", Appl. Phys. Lett. 69 (21), Nov. 18, 1996; M. Maximov et al., "High Power Continuous Wave Operation InGaAs/AlGaAs Quantum Dot Laser", J. Appl. Phys., 83, 10, May, 1998.

In the present invention, the non-continuous layer, in the form of quantum dots or other forms, is used to advantage in the barrier layer of a tunnel junction of a device that employs lateral electron flow into the tunnel junction.

In accordance with an embodiment of the invention, there is provided a semiconductor light emitting device that includes: a semiconductor active region disposed between first and second semiconductor layers, the first semiconductor layer being p-type, and the second semiconductor layer being n-type; tunnel junction means disposed over the first semiconductor layer, the tunnel junction means including a tunnel barrier region that is a non-continuous layer; means for coupling electric potential between the tunnel junction means and the second semiconductor layer; and means for causing lateral electron flow into the tunnel junction means.

In a preferred embodiment of the invention, the tunnel junction means comprises an n+/p+ junction oriented with the p+ portion thereof adjacent the first semiconductor layer, and wherein the n+/p+ junction includes the tunnel barrier region that is a non-continuous layer. In this embodiment, the n+/p+ junction is a GaAs junction modified with an $In_xGa_{1-x}As$ tunnel barrier region which is the non-continuous layer. The non-continuous layer can be in the form of a pattern or can be stochastic in form and/or arrangement.

Further features and advantages of the invention will become more readily apparent from the following detailed description when taken in conjunction with the accompanying drawings.

DETAILED DESCRIPTION

Figure 1:
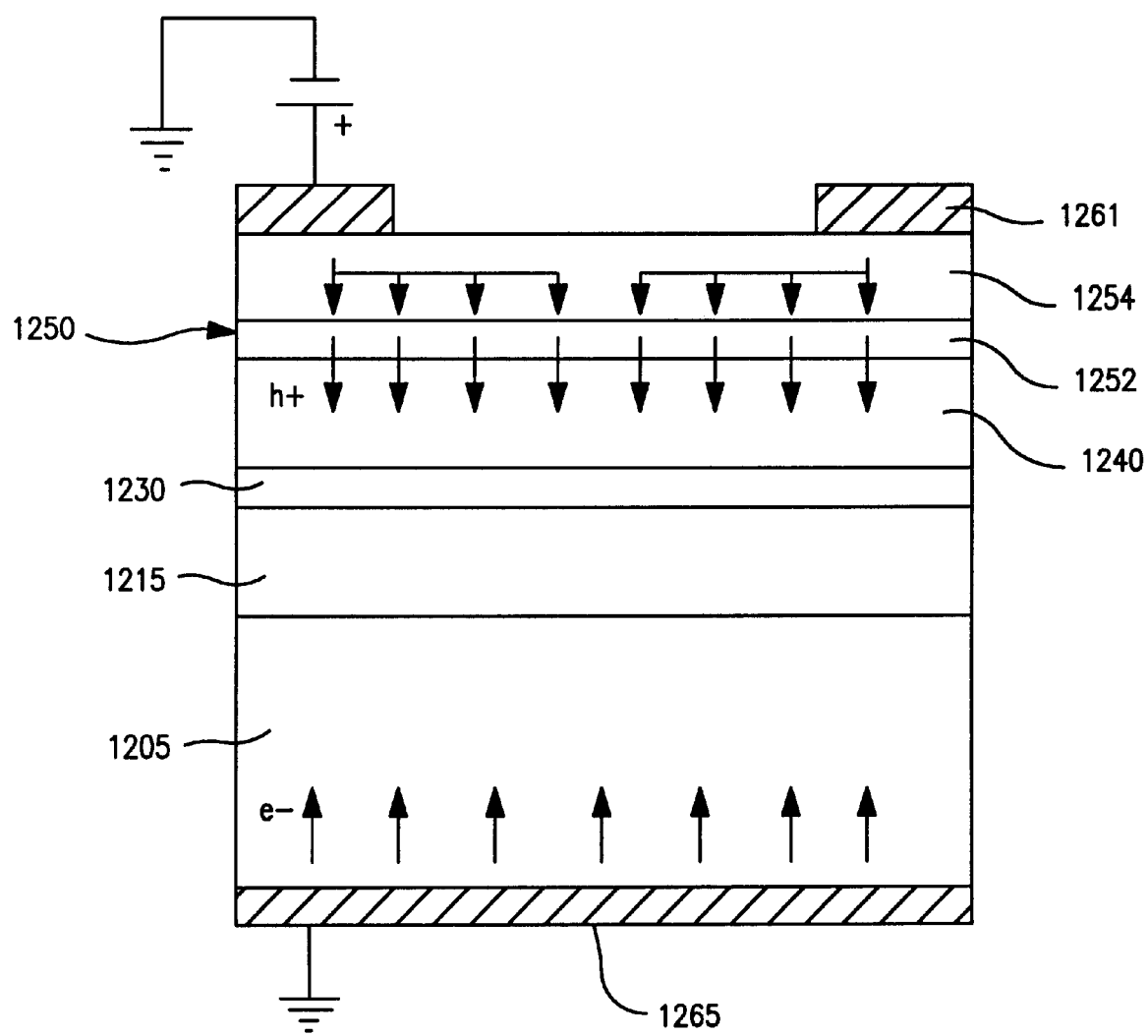
FIG. 1 is a cross-sectional view of a light emitting device of the type disclosed in U.S. Pat. No. 5,936,266, as modified in accordance with the improvement of the invention.

An embodiment of the above-referenced U.S. Pat. No. 5,936,266 is shown in FIG. 1. A light emitting diode (LED) includes an n-type substrate 1205 having an n-type confining layer 1215 disposed thereon. The substrate 1205 may be, for example, GaAs or GaP, and the lower confining layer 1215 may be, for example, n-type AlGaAs. An active region is represented at 1230, and is selected to obtain the desired light wavelength. As one example, the active region may be bulk AlGaInP or may include one or more quantum wells of GaAs or InGaP between layers of AlGaInP. An upper confining layer 1240 is a p-type layer, for example a layer of p-type AlGaAs or AlInP. Above the p-type upper confining layer 1240 is the p+ layer 1252 and an n+ layer 1254. Both of these layers may be heavily doped GaAs or, of particular interest herein, the n+ portion may include two n+ layers, such as a layer of n+ InGaAs with n+ GaAs thereon. The tunnel junction is labelled at 1250. As described in Richard, Chen, Sugg, Hofler, and Holonyak, Appl. Phys. Lett., 63, (26), 1993, a basic GaAs p-n tunnel junction can be modified by employing a thin (e.g. ~100 Angstrom) $In_xGa_{1-x}As$ strained layer in the barrier region to reduce the energy gap ($\Delta E_g$=100–130 mev) and carrier mass and thus increase the tunneling probability without sacrificing the high injection barrier and voltage of GaAs. In essence, low gap tunneling was introduced into a high gap injection device. Metal contacts 1261 and 1265, which may be, for example Ti/Au or Ge/Au, are respectively applied to the top and bottom of the light emitting diode. A positive potential can be applied via the contacts, as shown. Further embodiments are set forth in the above-referenced U.S. Pat. 5,936,266 showing the same or similar principle being employed in laser operation, such as in a VCSEL (vertical cavity surface emitting laser), which can preferably have a collar formed of a native oxide of aluminum gallium arsenide, and which can employ lateral electron current confined at least in part by a native oxide.

In accordance with a feature hereof, the thin $In_xGa_{1-x}As$ layer can be non-continuous. The $In_xGa_{1-x}As$ layer could be "cut up" into parallelepiped boxes or quantum boxes or quantum dots (as in quantum dot injection devices, e.g., lasers) but, for the present purpose, to provide an array of thin tiny box-like or dot-like tunnel barriers. An electron tunnels with high probability via the dot. Thus, for example, in a VCSEL driven with lateral electron current, sufficient injection is expected (via the tunnel dots or islands) for VCSEL operation, but with reduced absorption of the recombination radiation (photons) in the laser operation directed vertically through the tunnel region. The reduced absorption would also be advantageous in LED operation, as in the simplified illustration. Thus, a tunnel contact of reduced absorption is possible in spite of the lower gap of the quantum dot barriers (which, it is noted, can be stochastic in form and arrangement).

Figure 2:
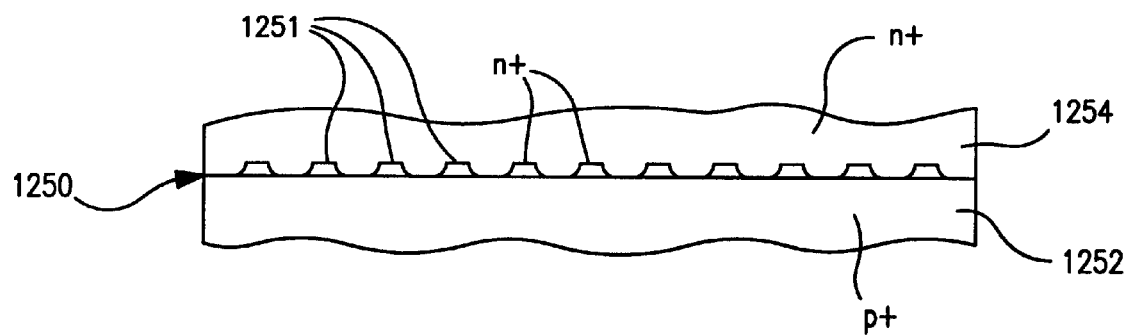
FIG. 2 is a partially broken away cross-sectional view that illustrates an example of a non-continuous barrier layer in the device of FIG. 1.
Figure 3:
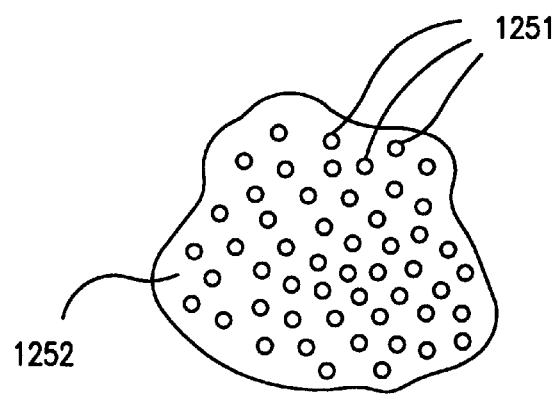
FIG. 3 is a top partially broken away view of a portion of the non-continuous barrier layer of FIG. 2.

FIG. 2 shows an example of a non-continuous barrier layer 1251 in the device of FIG. 1. Layers 1252 and 1254 are respectively the p+ and n+ layers (e.g. heavily doped GaAs layers) of the FIG. 1 device, and, in this example, the non-continuous barrier layer 1251 comprises quantum dots of n+ InGaAs in the form of truncated prisms or truncated cones. FIG. 3 shows an example of a portion of the layers 1252 and 1251, before deposition of the layer 1254. The dots, or other configuration, preferably cover less than half the area of layer 1252, and preferably cover a fraction of the area in the range 0.05 to 0.50, so that the available uncovered area fraction is preferably in the range 0.50 to 0.95, with substantial reduction in absorption of recombination radiation from the active region of the device.

The non-continuous layer can be obtained by any suitable technique (e.g. of the type used in existing quantum dot laser fabrication), for example by employing a tilted crystallographic plane for seeding of the dot regions, by droplet epitaxy, or by any other suitable technique known in the art.

It will be understood that GaAs and InGaAs are illustrative and that other III–V higher-gap lower-gap systems, for example AlGaAs-GaAs-InGaAs, InAlGaP-InGaP-GaAs, and other combinations.

What is claimed is:

1. A semiconductor light emitting device, comprising:

a semiconductor active region disposed between first and second semiconductor layers, said first semiconductor layer being p-type, and said second semiconductor layer being n-type;

tunnel junction means disposed over said first semiconductor layer, said tunnel junction means including a tunnel barrier region that is a non-continuous layer;

means for coupling electric potential between said tunnel junction means and said second semiconductor layer; and means for causing lateral electron flow into said tunnel junction means.

2. The device as defined by claim 1, wherein said tunnel junction means comprises an n+/p+ junction oriented with the p+ portion thereof adjacent said first semiconductor layer, and wherein said n+/p+ junction includes said tunnel barrier region that is a non-continuous layer.

3. The device as defined by claim 1, wherein the n+/p+ junction is a GaAs junction modified with an $In_xGa_{1-x}As$ tunnel barrier region that is said non-continuous layer.

4. The device as defined by claim 2, wherein the n+/p+ junction is a GaAs junction modified with an $In_xGa_{1-x}As$ tunnel barrier region that is said non-continuous layer.

5. The device as defined by claim 4, wherein said $In_xGa_{1-x}As$ layer is a strained layer, and wherein x is less than about 0.1.

6. The device as defined by claim 2, wherein said non-continuous layer includes separated dots.

7. The device as defined by claim 4, wherein said non-continuous layer includes separated dots.

8. The device as defined by claim 2, wherein said non-continuous layer is a pattern or is stochastic in form and/or arrangement.

9. The device as defined by claim 4, wherein said non-continuous layer is a pattern or is stochastic in form and/or arrangement.

10. The device as defined by claim 6, wherein said dots are in the form of truncated pyramids or truncated cones.

11. The device as defined by claim 7, wherein said dots are in the form of truncated pyramids or truncated cones.

12. The device as defined by claim 1, wherein said non-continuous layer has a total area of less than half the area on which it is disposed.

13. The device as defined by claim 2, wherein said non-continuous layer has a total area of less than half the area on which it is disposed.

14. The device as defined by claim 4, wherein said non-continuous layer has a total area of less than half the area on which it is disposed.

15. The device as defined by claim 2, wherein said non-continuous layer has a total area that is a fraction of the area on which it is disposed, said fraction being in the range 0.05 to 0.50.

16. The device as defined by claim 4, wherein said non-continuous layer has a total area that is a fraction of the area on which it is disposed, said fraction being in the range 0.05 to 0.50.

17. The device as defined by claim 2, wherein at least part of said lateral electron flow is in the n+ portion of said tunnel junction means.

18. The device as defined by claim 4, wherein at least part of said lateral electron flow is in the n+ portion of said tunnel junction means.

19. The device as defined by claim 2, wherein said means for coupling an electrical potential comprises means for coupling a positive potential to said tunnel junction means with respect to said second semiconductor layer so that the tunnel junction is reverse biased.

20. The device as defined by claim 4, wherein said means for coupling an electrical potential comprises means for coupling a positive potential to said tunnel junction means with respect to said second semiconductor layer so that the tunnel junction is reverse biased.

* * * * *